US007633386B2

(12) United States Patent
Bennett

(10) Patent No.: US 7,633,386 B2
(45) Date of Patent: Dec. 15, 2009

(54) AMPLIFIER FOR MULTI-USE OF SINGLE ENVIRONMENTAL SENSOR

(75) Inventor: Steven Ian Bennett, Portsmouth (GB)

(73) Assignee: Thorn Security Limited, Sunbury-on-Thames (GB)

( * ) Notice: Subject to any disclaimer, the term of this patent is extended or adjusted under 35 U.S.C. 154(b) by 318 days.

(21) Appl. No.: 11/886,611

(22) PCT Filed: Jan. 18, 2006

(86) PCT No.: PCT/GB2006/000162

§ 371 (c)(1),
(2), (4) Date: Sep. 17, 2007

(87) PCT Pub. No.: WO2006/106281

PCT Pub. Date: Oct. 12, 2006

(65) Prior Publication Data

US 2009/0033483 A1    Feb. 5, 2009

(30) Foreign Application Priority Data

Apr. 6, 2005    (GB) ................................. 0506989.3

(51) Int. Cl.
G08B 29/00    (2006.01)
H03K 5/00    (2006.01)
G01N 9/00    (2006.01)

(52) U.S. Cl. ...................... 340/511; 340/501; 340/628; 330/291; 327/94; 327/95; 327/580; 73/23.26

(58) Field of Classification Search .................. 340/511
See application file for complete search history.

(56) References Cited

U.S. PATENT DOCUMENTS 3,541,435 A    11/1970    Foster et al.
3,550,020 A    12/1970    Gill et al.
3,663,833 A    5/1972    Pao et al.

(Continued)

FOREIGN PATENT DOCUMENTS

DE    32 16 707 A1    5/1982

(Continued)

*Primary Examiner*—Donnie L Crosland

(57) ABSTRACT

A detection system in which a single sensor is employed to detect an extensive range of a parameter. The output signal from the sensor is fed to the input of the electrical circuit, having a feedback loop, wherein the electrical circuit has a non-linear transfer characteristic. The non-linear transfer characteristic is achieved by changing the behavior of the feedback loop of the electrical circuit at a predetermined level of input signal. The output of the circuit has a proportional relationship with the input until the input signal reaches this predetermined value, whereupon the behaviors of the feedback loop changes and the relationship of the output to the input of the circuit changes. While the input signal is above the predetermined value, the output of the circuit has a linear but disproportionate relationship with the input at a gradient different to that when the input signal is below the predetermined value. Further, the behavior of the feedback loop changes to create a knee point in the response between the proportional and the linear parts of the characteristic. In this way, an overall non-linear transfer characteristic is produced by the electrical circuit, the transfer characteristic having with a well-defined knee point. The resolution of input signals below the knee point may be greater than the resolution of signals above the knee point.

30 Claims, 2 Drawing Sheets

U.S. PATENT DOCUMENTS

| | | |
|---|---|---|
| 3,999,060 A | 12/1976 | Skagerlund |
| 4,351,181 A | 9/1982 | Currans |
| 4,476,583 A | 10/1984 | Muterspaugh |
| 4,586,143 A | 4/1986 | Kaneyasu et al. |
| 5,264,781 A | 11/1993 | Miller et al. |
| 5,754,013 A | 5/1998 | Praiswater |
| 6,246,284 B1 | 6/2001 | Nemoto |

FOREIGN PATENT DOCUMENTS

| | | |
|---|---|---|
| DE | 37 42 334 A1 | 12/1987 |
| DE | 40 26 682 A1 | 8/1990 |
| GB | 1 211 921 | 11/1970 |
| GB | 2 413 635 A | 11/2005 |

AMPLIFIER FOR MULTI-USE OF SINGLE ENVIRONMENTAL SENSOR

RELATED APPLICATION

This application claims the benefit of the prior foreign application GB 0506989.3, filed Apr. 6, 2005. The entire teachings of the above application are incorporated herein by reference.

BACKGROUND OF THE INVENTION

The present invention relates to an electrical circuit, and more particularly a non-linear transimpedance amplifier for use in a detection system. The present invention also relates to a method of changing the gain of an electrical circuit.

The existence of a fire, for example, may be detected by various means, and it is known to employ a plurality of sensing elements that are responsive to different parameters. One such sensing element may be a carbon monoxide gas detector. In some installations there is a requirement also to detect toxic gases, of which carbon monoxide may be one. Conventionally, separate fire and gas detection circuits are installed each having, for example, its own carbon monoxide sensing element. The fire and gas detection circuits are arranged to provide, separately, the required measurement accuracy. The fire circuit and sensing element are sensitive to, say, a range of 0 to 40 parts per million (PPM) and the gas detection circuit and sensing element are sensitive to, say, a range of 35 to 500 PPM.

It is advantageous, in some instances, to have an arrangement of a single sensor and detector for detecting both fire and toxic levels of gas. However, by simply replacing two sensors and their respective detectors with a single sensor and detector, accuracy of measurement over a range of, say, 0 to 500 PPM may not be sufficiently accurate. This is particularly true for measurements at the lower end of the range, which are generally used to detect the existence of fire. For example, when low output levels are sent from a detector to an analogue-to-digital converter (ADC) or comparator having a limited resolution, the quantisation effect could result in the signal being rounded to levels that are too coarse to be of use.

A known approach to solving this problem is to use a non-linear device within a detector. In this way, the gain of the detector may be high when a small input signal is present and low when a high input signal is present. Examples of non-linear devices include diodes, varistors and Zener diodes. However, these devices have undesirable characteristics that result in unreliable or unpredictable operation, including temperature dependency, leakage current, noise and tolerance. In addition, U.S. Pat. No. 5,061,865 discloses a complex solution to the problem in the form of a non-linear transimpedance amplifier comprising an accumulator, a comparator, a sample and hold and a summer. This is not an ideal solution to the problem due to factors such as component cost, component count and power consumption.

It is an aim of the present invention to provide an electrical circuit having a non-linear response, or transfer charcteristic. The circuit finds application, for example, in a detection system.

SUMMARY OF THE INVENTION

In accordance with the present invention, a detection system may be provided in which a single sensor is employed to detect an extensive range of a parameter. The output signal from the sensor is fed to the input of the electrical circuit, having a feedback loop, wherein the electrical circuit has a non-linear transfer characteristic. The non-linear transfer characteristic is achieved by changing the behaviour of the feedback loop of the electrical circuit at a predetermined level of input signal. The output of the circuit has a proportional relationship with the input until the input signal reaches this predetermined value, whereupon the behaviour of the feedback loop changes and the relationship of the output to the input of the circuit changes. While the input signal is above the predetermined value, the output of the circuit has a linear but disproportionate relationship with the input at a gradient different to that when the input signal is below the predetermined value. Further, the behaviour of the feedback loop changes to create a knee point in the response between the proportional and the linear parts of the characteristic. In this way, an overall non-linear transfer characteristic is produced by the electrical circuit, the transfer characteristic having with a well-defined knee point. The resolution of input signals below the knee point may be greater than the resolution of signals above the knee point. The term "proportional" is used to mean that the ratio of the output signal to the input signal is constant. The term "linear" is used to mean that the ratio of a change in the output signal to the corresponding change in the input signal is constant.

In one embodiment of the present invention, there is provided an electrical circuit comprising an amplifier and a feedback loop, the amplifier being arranged to receive an input signal and to provide an output signal, the feedback loop comprising first and second parallel branches, wherein one branch comprises a switching means, and wherein: the switching means is caused to switch when the input signal reaches a predetermined value; and wherein the switching means is arranged such that when it switches, the current flowing through one branch remains substantially unchanged and, when the input signal is greater than the predetermined value, the current flowing through the switching means is controlled by the switching means.

In this way, the gain of the electrical circuit is greater when current is flowing only through the first branch of the feedback loop. The gain of the electrical circuit reduces when current begins to flow through the second branch of the feedback loop. The gain reduces gradually because the current flowing through the first branch is prevented from decreasing when the second branch is switched into the feedback loop. A non-linear response to the input signal is achieved having a well defined knee point, the knee point being where the input current reaches the predetermined value. The electrical circuit is more sensitive to signals below the knee point and less sensitive to signals above the knee point.

Preferably, the switching means operates using a diode effect. In this way, a voltage is maintained across the switching means when it has been caused to switch. This voltage may be used to maintain the current in one branch of the feedback loop when the switching device switches, and may be used to control the current flowing through the switching device.

Preferably, one branch comprises a resistive element. Preferably, each branch comprises a resistive element. In this way, the current flowing through each branch is limited and is proportional to the voltage across each respective resistive element. The characteristic response of the electrical circuit can be adjusted by changing the value of the resistive elements.

In a preferred embodiment, the switching means is a transistor. In this way, the predetermined value may be altered by changing the bias voltage of the transistor. Preferably, the transistor operates in a cut-off mode when the input signal is below the predetermined value. Preferably, the transistor operates in an active mode when the input signal is equal to or greater than the predetermined value. In this way, the transistor is not saturated and the current flowing through it is controlled by the bias voltage and the relative value of the resistive branch. The transistor is preferably a bipolar junction transistor, and is more preferably a pnp bipolar junction transistor. Preferably, the collector terminal of the transistor is connected to the input of the amplifier and the emitter terminal is connected to a resistive element which is in turn connected to the output of the amplifier. Preferably, the collector terminal is connected to a feedback node, where a portion, at least, of the output of an amplifier is fed back to the input of the amplifier. In this way, a sharp transition is achieved at the knee point. Preferably, means for applying a bias voltage to the base of the transistor is provided. In this way, the predetermined value of the circuit can be adjusted. Preferably, the transistor is such as to switch from a cut-off mode to an active mode when the voltage at the emitter terminal reaches a value equal to the bias voltage plus the transistor switch-on voltage. The arrangement may be such that the voltage at the emitter of the transistor is controlled to compensate for variations of the transistor switch-on voltage with temperature. Alternatively, the arrangement may be such that the bias voltage of the transistor is controlled to compensate for variations of the transistor switch-on voltage with temperature. In this way, measurement accuracy is maintained with changing temperature.

In another embodiment, the switching means is a Zener diode. In this way, a high current is available to whichever device is providing the input signal to the circuit.

Preferably, the amplifier is an operational amplifier. An operational amplifier provides a high gain block with a single ended output. Preferably, the inverting terminal is connected to an input from the sensor. The non-inverting terminal may be connected to a reference voltage. In this way, the amplifier may be operated on a voltage pedestal allowing calibration of the circuit. Preferably, the feedback loop is connected between the output and the non-inverting input. In this way, the feedback is negative.

Preferably, the detecting circuit is a transimpedance amplifier. Preferably, the input signal is an electrical current.

In a second embodiment of the invention, there is provided a detection system comprising the electrical circuit and a sensor for detecting a single parameter. Preferably, the sensor detects carbon monoxide across two ranges. In a preferred embodiment, the output of the sensor is connected to the input of the electrical circuit. Preferably, the detection system further comprises an analogue-to-digital converter or a comparator, where preferably the output of the electrical circuit is connected thereto.

In a third embodiment of the invention, there is provided a method of changing the transfer characteristic of an electrical circuit when an input signal reaches a predetermined level, the method comprising the steps of allowing a current to flow through a first feedback loop, switching a second feedback loop into the circuit when the input signal reaches a predetermined level to allow current to flow through the second feedback loop, and controlling the current flowing through the second feedback loop such that the current flowing through the first feedback loop is undisturbed when the second feedback loop switches into the circuit.

Preferably, the method further comprises the step of using a single switching means both to switch the second feedback loop into the circuit and to control the current flowing through the second feedback loop.

BRIEF DESCRIPTION OF THE DRAWINGS

An electrical circuit and detection system in accordance with the present invention will now be described by way of example, with reference to the accompanying drawings, in which.

DESCRIPTION OF PREFERRED EMBODIMENT

Figure 1:
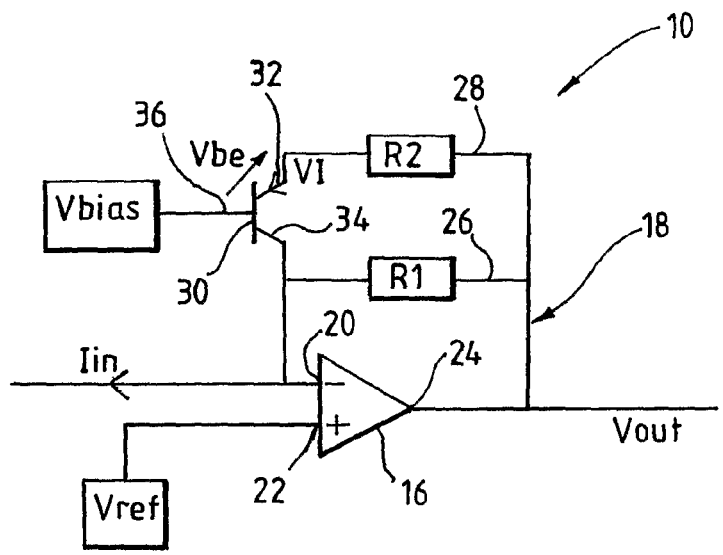
FIG. 1 is a schematic diagram of an electrical circuit in accordance with an embodiment of the present invention.
Figure 3:
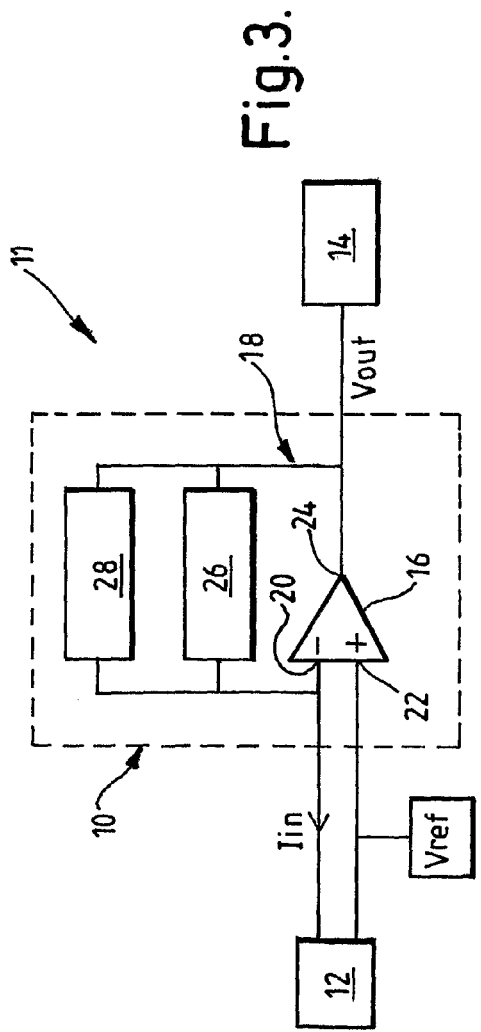
FIG. 3 is a block diagram of a detecting system including the electrical circuit of FIG. 1.

With reference to FIGS. 1 and 3, an electrical circuit 10 is provided which has a non-linear response to an input signal, Iin. For example, in a building management safety system, the circuit 10 can be used in a detection circuit 11 with a single detection element 12 to monitor carbon monoxide (CO) levels and an analogue-to-digital converter (ADC) 14 to convert the output into an appropriate form. The detection circuit 11 is used within the building management safety system to indicate the presence of a fire and/or the presence of a toxic level of carbon monoxide.

The circuit 10 comprises an operational amplifier (op-amp) 16 having a feedback loop 18. The operational amplifier 16 has an inverting input 20, a non-inverting input 22 and an output 24. The detection element 12 is connected to the inverting input 20 of the operational amplifier 16 and provides an input signal current, Iin. The operational amplifier 16 provides an output voltage, Vout, which is connected to the ADC 14. The feedback loop 18 is connected between the output 24 and the inverting input 20 of the operational amplifier 14. The non-inverting input of the operational amplifier 22 is connected to a reference voltage, Vref, and to the detecting element 12.

The feedback loop 18 comprises two parallel branches 26, 28. Branch 26 comprises a single resistor R1 connected between the output 24 and the inverting input 20. Branch 28 comprises a single resistor R2 connected in series with a pnp bipolar junction transistor (BJT) 32. The resistor R2 is connected between the output 24 of the operational amplifier 16 and the emitter of the transistor 32. The collector of the transistor 34 is connected to the inverting input 20 of the operational amplifier 16. The base of the transistor 36 is biased with a bias voltage, Vbias.

For the following explanation of the operation of the electrical circuit 10, the operational amplifier 16 is assumed to be ideal. Firstly, it is assumed that the output of the operational amplifier attempts to do whatever is necessary to make the voltage difference between the inverting and non-inverting inputs 20, 22 equal to zero. Secondly, it is assumed that the inputs 20, 22 draw no current. Therefore, the operational amplifier will try to hold the inverting terminal 20 at Vref. The input current, Iin, being sunk by the detecting element 12 flows in the feedback loop 16. When the input current changes, the output of the operational amplifier 24 adjusts until the current flowing in the feedback loop 18 is equal to that being sunk by the detecting element 12.

At low levels of input current, the transistor 30 is cut-off and no current flows through branch 28 of the feedback loop 18. All of the input current, Iin, flows through the branch 26 and a voltage develops across the resistor R1. The detecting circuit 10 behaves as a known transimpedance operational amplifier with resistive feedback, and has a constant gain equal to R1. The voltage at the emitter 32 of the transistor 30 is equal to the output voltage, Vout, as no current flows in the branch 28.

As the level of carbon monoxide sensed by the detection element 12 increases, the input current, Iin, generated by the detection element increases. The output voltage, Vout, of the operational amplifier 16 increases rapidly to make the voltage difference between the inverting and non-inverting terminals 20, 22 equal to zero. Consequently, the voltage across the resistor R1 increases and the current flowing through the branch 26 increases until it again becomes equal to the input current, Iin. Now, when the input current increases sufficiently to cause the output voltage, Vout, and hence the voltage at the emitter terminal 32, to become equal to the base bias voltage, Vbias, plus the switch-on voltage, Vbe, of the transistor 30, the transistor switches into its active mode. The emitter voltage required to switch on the transistor 30 is herein termed the knee voltage, V1. The knee voltage, V1, is determined by the base bias voltage, Vbias, and the transistor switch-on voltage, Vbe. It is important to note that, when the transistor 30 switches into its active mode, the resistor R2 of the branch 28 is not merely switched into parallel with the resistor R1 of the branch 26. The current flowing in the branch 28 of the feedback loop 18 is controlled by the voltage across the resistor R2. When the transistor 30 is operating in its active mode, the voltage across the resistor R2 is the difference between the output voltage, Vout, of the operational amplifier 16 and the knee voltage, V1, required to switch the transistor 30 into its active mode. Therefore, when the transistor 30 first switches into its active mode, an insignificant amount of current flows through the resistor R2 as the voltage across it is substantially zero. It is to be emphasised that, when the transistor 30 switches into its active mode, the current flowing through R1 does not decrease. This is because the output voltage, Vout, does not decrease when the transistor 30 first switches into its active mode as the total current in the feedback loop 18 remains the same and flows entirely through the branch 26. If the branch 28 was merely switched into the circuit such that the resistor R2 was in parallel with the resistor R1, then the total current through the feedback loop 18 would immediately increase, causing the output voltage, Vout, to decrease to balance the current through the feedback loop 18 with the input current, Iin. It will be seen that, in that case, the gain of the circuit 10 would immediately step to a lower value. The present invention ensures a smooth transition between different gain characteristics around a well defined knee point.

As the level of carbon monoxide sensed by the detection element 12 increases further, the input current, Iin, increases and the output voltage, Vout, increases. The output voltage, Vout, increases to ensure that the current flowing in the feedback loop 18 is equal to the input current, Iin. With increasing output voltage, Vout, the voltage across the respective resistors R1 and R2 also increases and the current flowing in each branch 26, 28 increases. The total current in the feedback loop 18 now increases disproportionally to the output voltage, Vout, when compared to the situation previously when the transistor 30 was operating in its cut-off mode. In this way, once the transistor 30 is switched into its active mode, the gain of the circuit 10 decreases for increasing input current, Iin. The proportion of current flowing in the two branches 26, 28 is determined by the respective value of each resistor R1 and R2. As will be apparent, the gain of the detecting circuit 10 over an extended range of input current, Iin, is not constant and decreases as the input current increases past the knee point.

Figure 2:
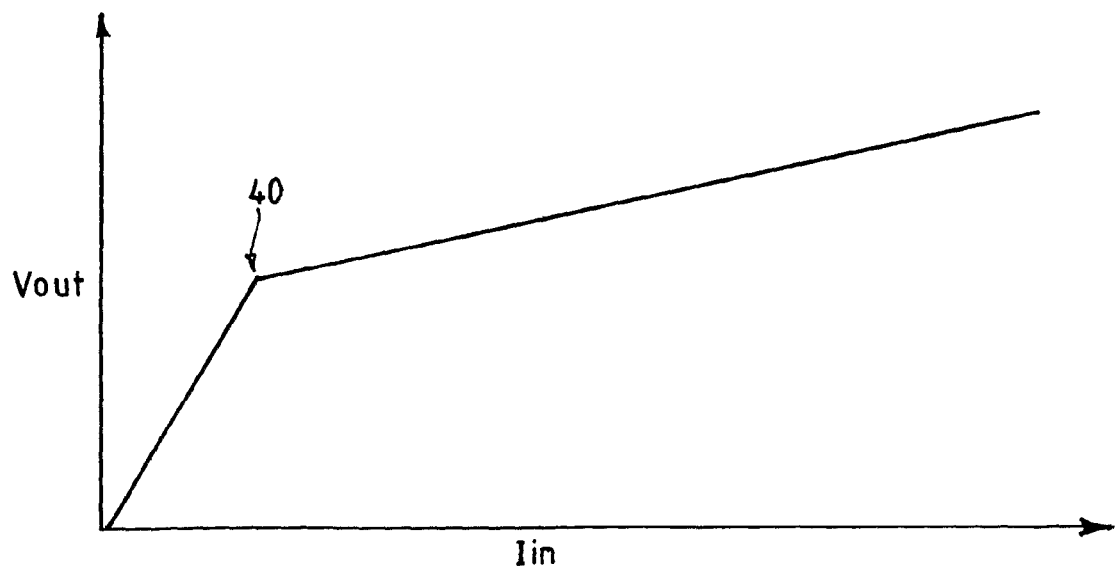
FIG. 2 is a schematic graph showing the input versus output characteristic of the electrical circuit of FIG. 1.

FIG. 2 shows a typical response characteristic of the electrical circuit 10. The output voltage, Vout, of the electrical circuit 10 is clearly more sensitive to changes in input current, Iin, below the knee point 40 than to changes in input current above the knee point.

Figure 4:
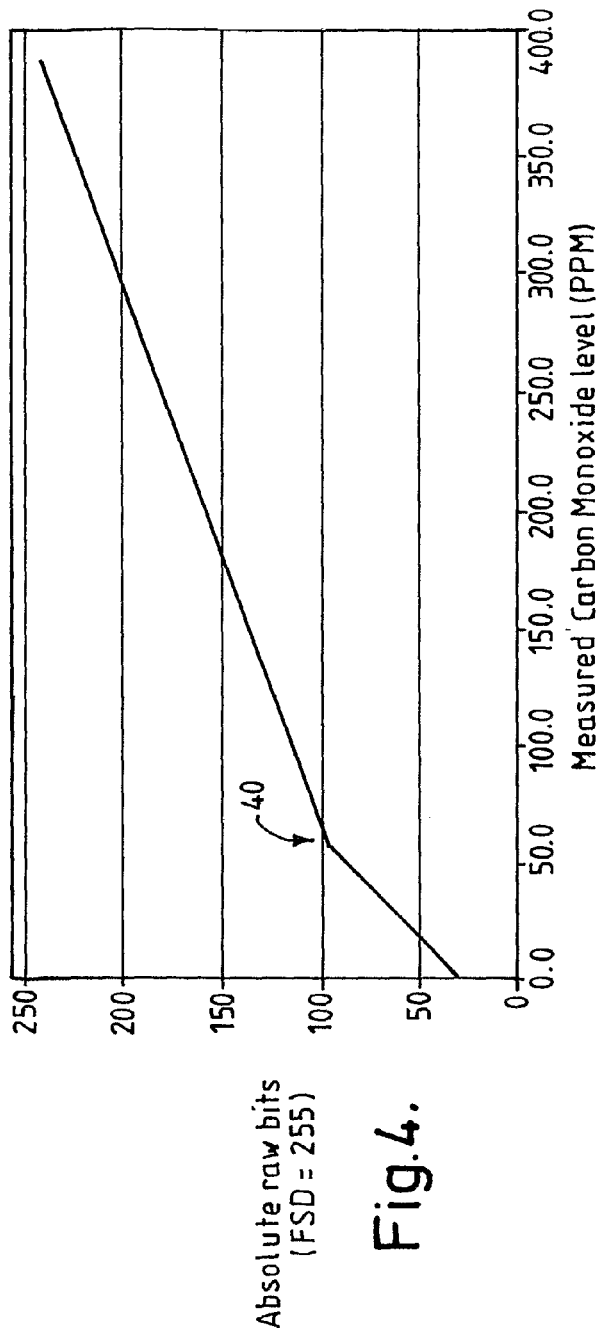
FIG. 4 is a schematic graph showing the input versus output characteristic of the detecting system of FIG. 3.

Similarly, FIG. 4 shows a typical response characteristic for the detection system 11. The graph shows that the detection system 11 is more sensitive to changes in the measured level of carbon monoxide below the knee point 40. More absolute raw bits are allocated per change in level below the knee point 40 giving the system 11 a high resolution for low levels of carbon monoxide. The detection system 11 is less sensitive to changes in the measured level of carbon monoxide above the knee point 40. Fewer absolute raw bits are allocated per change in level of carbon monoxide above the knee point 40, giving the system a lower resolution for higher levels of carbon monoxide. In this way, the full output range of the ADC of 256 bits is shared efficiently across the measured range of carbon monoxide, and more efficient use of available system bandwidth becomes possible.

The equation governing the output voltage, Vout, of the detection circuit 10 may be derived as follows:

If Iin*R1 ≤ V1 then Vout=Iin*R1,

If Iin*R1 > V1 then Vout=V1+((Iin−(V1/R1))* ((R1*R2)/(R1+R2)))

Carbon monoxide levels indicative of a fire are usually in the range of 0 to 40 PPM, whilst concentrations of carbon monoxide between 35 and 500 PPM are usually considered to be toxic gas levels. For reliable fire detection it will be appreciated that the detection system 11 is required to be sensitive to changes in carbon monoxide in the range of 0 to 40 PPM while for toxic gas detection above, say, 35 PPM, the detector is not required to be so sensitive, but is required to operate across a wider range up to, say, 500 PPM.

The detection system 11 described hereinabove provides the advantage that the gain of the electrical circuit 10 changes at a knee point when the input signal from the detecting element 12 reaches a predetermined level. Therefore, the sensitivity of the detection system 11 is different for different ranges of input signal. In this way, a single detection element 12 in the detection system 11 can be used for measuring carbon monoxide for the detection of fire and for the detection of a toxic level of the gas.

It will be appreciated that the electrical circuit 10 may be used in any system for detecting a parameter, whether the parameter is carbon monoxide or not, where different sensitivities to the parameter, and hence output resolutions, are required within a measured range, particularly so where a higher resolution is required for low levels of the measured parameter.

It will be appreciated that the feedback loop 18 may comprise more than one branch 28 having a transistor 30, each of which may be biased to switch into the feedback loop at the same or different knee points. In this way, multiple knee points may be achieved.

It will be appreciated that the transistor 30 may be replaced with a different active device, for example a field-effect transistor (FET) or a npn bipolar junction transistor. If a FET is used, extra circuitry would be required to compensate for the variability of the gate to source voltage, Vgs.

In a modified embodiment, not shown, a Zener diode is used instead of the transistor 30. In this embodiment, the transition around the knee point would not be as clean, but a higher current would be available to the detection element 12 if required, for example, when it is saturated with a high level of the measurand.

It will be appreciated that it is, at least in part, the diode effect of the transistor or Zener diode which controls the current flowing in the branch 28.

In a further modified embodiment, not shown, the bias voltage of the transistor, Vbias, is temperature compensated using a second transistor. This will remove temperature variations in the knee voltage, V1, due to the thermal variation of the transistor switch-on voltage, Vbe. Alternatively, additional circuitry can be used to monitor and control the emitter voltage of the transistor 30.

The invention claimed is:

1. A hazardous condition detector comprising:
   a sensor for detecting a parameter, and for providing a first output signal based on the detected parameter; and
   an electrical circuit having a non-linear transfer characteristic and providing a second output signal, the second output signal having a proportional relationship with the first output signal until the first output signal reaches a determined level, the second output signal indicating a first hazardous condition; and, when the first output signal is above the predetermined level, the second output signal has a linear but disproportionate relationship with the first output signal at a gradient different to that when the first output signal is below the predetermined level, the second output signal thereby indicating a second hazardous condition.

2. A detector as claimed in claim 1, wherein the parameter is a carbon monoxide (CO) level.

3. A detector as claimed in claim 2, wherein the first hazardous condition is fire.

4. A detector as claimed in claim 3, wherein the second hazardous condition is a toxic CO level.

5. A detector as claimed in claim 1, wherein the electrical circuit further comprises an amplifier and a feedback loop, the amplifier being arranged to receive the first output signal and to provide the second output signal, the feedback loop comprising first and second parallel branches, a switching means being connected in series with the second branch, wherein the switching means operates in a cut-off mode when the first output signal is below the predetermined level, and operates in an active mode when the first output signal is equal to or above the predetermined level, and the switching means is caused to switch when the first output signal reaches the predetermined level, wherein the circuit is such that the gradient of the graph of the second output signal against the first output signal changes at the predetermined level to define a knee point, the gradient below the knee point being greater than the gradient above the knee point.

6. A detector as claimed in claim 5, wherein the switching means operates using a diode effect.

7. A detector as claimed in claim 5, wherein one branch of the feedback loop comprises a resistive element.

8. A detector as claimed in claim 5, wherein each branch of the feedback loop comprises a resistive element.

9. A detector as claimed in claim 5, wherein the switching means is a transistor.

10. A detector as claimed in claim 9, wherein the transistor is a bipolar junction transistor.

11. A detector as claimed in claim 10, wherein the collector terminal of the bipolar junction transistor is connected to the input of the amplifier, and the emitter terminal of said transistor is connected to a resistive element which is in turn connected to the output of the amplifier.

12. A detector as claimed in claim 9, further comprising means for applying a bias voltage to the base of the transistor.

13. A detector as claimed in claim 9, wherein the transistor is arranged so as to switch from a cut-off mode to an active mode when the voltage at the emitter terminal reaches a value equal to the bias voltage of the transistor plus the switch-on voltage of the transistor.

14. A detector as claimed in claim 9, wherein the arrangement is such that the voltage at the emitter of the transistor is controlled to compensate for variations of the transistor switch-on voltage with temperature.

15. A detector as claimed in claim 12, wherein the arrangement is such that the bias voltage of the transistor is controlled to compensate for variations of the transistor switch-on voltage with temperature.

16. A detector as claimed in claim 5, wherein the switching means is a Zener diode.

17. A detector as claimed in claim 5, wherein the amplifier is an operational amplifier.

18. A detector as claimed in claim 17, wherein the first output signal is connected to the inverting terminal of the operational amplifier.

19. A detector as claimed in claim 17, further comprising means for connecting a reference voltage to the non-inverting terminal of the operational amplifier.

20. A detector as claimed in claim 17, wherein the feedback loop is connected between the output and the non-inverting input of the operational amplifier.

21. A detector as claimed in claim 1, wherein the electrical circuit is a transimpedance amplifier.

22. A detector as claimed in claim 1, wherein the first output signal is an electrical current.

23. A detector as claimed in claim 1, wherein the sensor is arranged to detect a single parameter.

24. A detector as claimed in claim 23, wherein the sensor is such as to detect carbon monoxide across two ranges.

25. A detector as claimed in claim 23, wherein the output of the sensor is connected to the input of the electrical circuit.

26. A detector as claimed in claim 23, further comprising an analogue-to-digital converter or a comparator.

27. A detector as claimed in claim 26, wherein the output of the electrical circuit is connected to an input of the analogue-to-digital converter or comparator.

28. A method of detecting a hazardous condition, the method comprising:
   using a sensor to provide a first output signal based on a detected parameter;
   inputting the first output signal to an electrical circuit having a feedback loop and a non-linear transfer characteristic and providing a second output signal, the second output signal having a proportional relationship with the first output signal, until the first output signal reaches a predetermined level, the second output signal indicating a first hazardous condition; and
   when the first output signal is above the predetermined level, the second output signal has a linear but disproportionate relationship with the first output signal at a gradient different to that when the first output signal is below the predetermined level, the second output signal thereby indicating a second hazardous condition.

29. A method as claimed in claim 28, wherein the feedback loop is constituted by a first feedback loop and a second feedback loop, and the method further comprises the steps of:
   allowing a current to flow through the first feedback loop;
   switching the second feedback loop into the circuit when the input signal reaches the predetermined level to allow current to flow through the second feedback loop; and
   controlling the current flowing through the second feedback loop such that the gradient of the graph of the second output signal against the first output signal changes at the predetermined level to define a knee point, the gradient below the knee point being greater than the gradient above the knee point.

30. A method as claimed in claim 29, further comprising the step of using a single switching means both to switch the second feedback loop into the circuit and to control the current flowing through the second feedback loop.

* * * * *